United States Patent
Lundahl

(10) Patent No.: US 9,576,177 B2
(45) Date of Patent: Feb. 21, 2017

(54) FINGERPRINT SENSING DEVICE

(71) Applicant: FINGERPRINT CARDS AB, Göteborg (SE)

(72) Inventor: Karl Lundahl, Göteborg (SE)

(73) Assignee: FINGERPRINT CARDS AB, Göteborg (SE)

( * ) Notice: Subject to any disclaimer, the term of this patent is extended or adjusted under 35 U.S.C. 154(b) by 0 days.

(21) Appl. No.: 14/926,327

(22) Filed: Oct. 29, 2015

(65) Prior Publication Data
US 2016/0171271 A1    Jun. 16, 2016

(30) Foreign Application Priority Data
Dec. 11, 2014 (SE) .................................... 1451527-4

(51) Int. Cl.
    *G06K 9/00*      (2006.01)
    *G06F 3/044*      (2006.01)
    *G06F 3/0488*      (2013.01)
    *G06K 9/20*      (2006.01)

(52) U.S. Cl.
    CPC ............ *G06K 9/0002* (2013.01); *G06F 3/044* (2013.01); *G06F 3/0488* (2013.01); *G06K 9/00053* (2013.01); *G06K 9/209* (2013.01)

(58) Field of Classification Search
CPC .......................... G06K 9/00053; G06K 9/0002
See application file for complete search history.

(56) References Cited

U.S. PATENT DOCUMENTS

| | | | |
|---|---|---|---|
| 6,028,773 A | 2/2000 | Hundt | |
| 2002/0006687 A1* | 1/2002 | Lam .................. | H01L 27/14618 438/118 |
| 2003/0170933 A1* | 9/2003 | Manansala ........... | G06K 9/0002 438/116 |
| 2005/0243071 A1* | 11/2005 | Kent ..................... | G06F 3/0436 345/177 |
| 2011/0254108 A1 | 10/2011 | Gozzini et al. | |
| 2011/0309482 A1 | 12/2011 | Salatino et al. | |
| 2012/0098551 A1* | 4/2012 | Tsukamoto ............. | G06F 3/044 324/658 |
| 2014/0332908 A1 | 11/2014 | Ho et al. | |
| 2015/0163907 A1* | 6/2015 | Chang ..................... | H05K 1/11 361/761 |
| 2016/0210495 A1* | 7/2016 | Jagemalm ............ | G06K 9/0002 |

OTHER PUBLICATIONS

International Search Report mailed Mar. 8, 2016, for International Application PCT/SE2015/051318, 5 pages.

* cited by examiner

*Primary Examiner* — Oneal R Mistry
(74) *Attorney, Agent, or Firm* — Remarck Law Group PLC

(57) ABSTRACT

A fingerprint sensing device (and associated method of manufacturing) comprises a sensing chip arranged on a substrate with readout circuitry. The sensing chip comprising a plurality of sensing elements having a surface defining a sensing plane, each sensing element being configured to provide a signal indicative of an electromagnetic coupling between a sensing element and a finger placed on the sensing device; bond wires arranged between bond pads located on the sensing chip on the substrate, respectively, to electrically connect the sensing chip to the readout circuitry. A portion of the bond wire protrudes above the chip and an adhesive is arranged on the sensing chip to covering to cover the chip so that the portion of the bond wire protruding above the chip is embedded in the adhesive. A protective plate is attached to the sensing chip by the adhesive and forms an exterior surface of the device.

26 Claims, 8 Drawing Sheets

FINGERPRINT SENSING DEVICE

CROSS-REFERENCE TO RELATED APPLICATIONS

This application claims the benefit of Swedish Patent Application No. 1451527-4, filed Dec. 11, 2014. The disclosure of the above application is incorporated herein by reference in its entirety.

FIELD OF THE INVENTION

The present invention relates to a sensing device. More particularly, the present invention relates to a device for sensing fingerprints and to a method for manufacturing such a device.

TECHNICAL BACKGROUND

As the development of biometric devices for identity verification, and in particular of fingerprint sensing devices, has lead to devices which are made smaller, cheaper and more energy efficient, the possible applications for such devices are increasing.

In particular fingerprint sensing has been adopted more and more in, for example, consumer electronic devices, due to small form factor, relatively beneficial cost/performance factor and high user acceptance.

Capacitive fingerprint sensing devices, built based on CMOS technology for providing the fingerprint sensing elements and auxiliary logic circuitry, are increasingly popular as such sensing devices can be made both small and energy efficient while being able to identify a fingerprint with high accuracy. Thereby, capacitive fingerprint sensors are advantageously used for consumer electronics, such as portable computers, tablet computers and mobile phones, e.g. smartphones.

A fingerprint sensing chip typically comprises an array of capacitive sensing elements providing a measure indicative of the capacitance between several sensing structures and a finger placed on the surface of the fingerprint sensor. The sensing chip may further comprise logic circuitry for handling addressing of the array of sensing elements.

Furthermore, the sensing chip is often mounted on a separate readout substrate comprising readout circuitry, wherein contact pads of the sensing chip are provided for enabling an electrical connection via means of wire-bonding to corresponding contact pads of the readout substrate. The readout substrate may for example be a printed circuit board (PCB).

However, a wire bond protrudes above the surface of the sensing chip with a distance corresponding to the height of the bond plus the curvature of the bond-wire, commonly referred to as the wire bond loop height. Accordingly, protruding wire bonds introduce constraints in the assembly and design of a fingerprint sensor. In particular, in many applications is it desirable to provide a fingerprint sensing device which is flat, both for aesthetic reasons and as elevated portions of a sensing surface may lead to that a finger is partially lifted near the protruding portion.

In order to achieve a flat sensing surface, it is possible to provide a layer of top coating which is sufficiently thick so that the protruding wire bond is covered, thereby forming a flat outer surface. However, a thicker coating result in a weaker capacitive coupling between a finger placed on the surface and a sensing element located under the coating, which leads to a reduced accuracy of the sensing device.

US2011/0254108 discloses a fingerprint sensing device where the aforementioned problem of improving the capacitive coupling is addressed by providing a protective plate having dielectric properties enhancing the capacitive coupling between a finger on the surface of the plate and a sensing element located underneath the protective plate.

However, it is still desirable to reduce the distance between the surface of the fingerprint sensing device and the sensing structure to enhance the capacitive coupling.

SUMMARY OF THE INVENTION

In view of the above-mentioned desired properties of a fingerprint sensing device, and the above-mentioned and other drawbacks of the prior art, it is an object of the present invention to provide an improved fingerprint sensing device, and a method for manufacturing such a device.

According to a first aspect of the present invention, it is therefore provided a fingerprint sensing device comprising: a sensing chip arranged on the substrate, the sensing chip comprising a plurality of sensing structures each having a sensing element, wherein a surface of the sensing elements defines a sensing plane, each sensing element being configured to provide a signal indicative of an electromagnetic coupling between the sensing element and a finger placed on an exterior surface of the fingerprint sensing device; a bond wire arranged between a first bond pad located on said sensing chip and a second bond pad located on said substrate to electrically connect the sensing chip to the readout circuitry, wherein a portion of the bond wire protrudes above the sensing plane; an adhesive arranged on the sensing chip to cover the sensing chip such that the portion of the bond wire protruding above the sensing plane is embedded in the adhesive; and a protective plate attached to the sensing chip by means of the adhesive, the protective plate forming an exterior surface of the fingerprint sensing device.

The sensing chip should in the present context be understood as a chip comprising a plurality of sensing elements in the form of conductive plates or pads, typically arranged in an array, which are capable of forming a capacitive coupling between each sensing element and a finger placed on an exterior surface of the fingerprint sensing device. Through readout of the capacitive coupling for each sensing element, ridges and valleys of a fingerprint can be detected as a result of the distance dependence of the capacitive coupling. To achieve a fingerprint image with sufficient resolution, the sensing elements are typically substantially smaller than the features (ridges and valleys) of the finger. In general, a chip may also be referred to as a die.

The protective plate typically comprises a dielectric material in order to provide a good capacitive coupling between a finger placed on the plate and the sensing elements of the sensing chip. In particular the protective plate may advantageously comprise a glass or ceramic material, such as a chemically strengthened glass, $ZrO_2$ or sapphire. The above materials all provide advantageous properties in that they are hard and resistant to wear and tear, and in that they are dielectric thereby providing a good capacitive coupling between a finger placed on the surface of the protective plate and the sensing element of the sensing device. The protective plate described herein commonly forms the outer surface of the fingerprint sensing device.

The sensing device according to various embodiments of the invention may be formed on a conventional rigid PCB substrate or it may be implemented using a flexible type of substrate.

A wire bond is herein referred to as any type of wire bond suitable for use with the present application and is as such not limited to a particular bonding technique. For example, the wire bond may be a ball wire bond where the ball bumps (i.e. stud bumps) are formed at the sensing chip. The wire bond may also be a so called reverse wire bond where the ball bump is formed at the substrate in order to reduce the height of the wire bond on the sensing chip. The wire bond loop height is defined as the highest point of the bond wire loop as seen from the sensing plane, which is considered to be the same plane in which the bonding pads are located. Furthermore, bond pads may also be referred to as landing pads.

That the adhesive is arranged to cover the sensing chip means that the adhesive is arranged to cover substantially the entire area of the sensing chip which is desirable in order to provide uniform adhesion and uniform electrical properties between the sensing chip and the protective plate.

The present invention is based on the realization that it is possible to reduce the distance between the sensing plane and the sensor surface by embedding the bond wires in an adhesive used for attaching the protective plate to the sensing chip. Through the reduced distance the capacitive coupling is improved and the sensor sensitivity is increased. Furthermore, no spacer layer or the like is needed to compensate for the bond wire loop height and it is also possible to use an adhesive which is uniform over the entire sensing chip surface as no modifications of the adhesive is required at the locations of the bond wires. An additional advantage is that the fingerprint sensing device according to the invention does not require molding, thereby eliminating a costly manufacturing step.

A further advantage of the present invention is that an adhesive may be provided which has a high accuracy in nominal thickness and a high uniformity laterally across the sensing chip area. Since it is common that there are strict requirements on the overall accuracy and uniformity of the sensor device, a high accuracy in the thickness of the adhesive allows for a lower planarity of the protective plate, thereby making it possible to maintain overall tolerances with respect to thickness variations while using a less planar/accurate protective plate, which in turns allows the use of a protective plate having a higher surface roughness thereby leading to reduced cost. Moreover, when compared to a molding process, the inventive concept is not relying on accurate placement of the die, nor on back-grinding tolerances of the wafer.

Moreover, the sensing device according to various embodiments of the invention provides an advantage over alternative solutions for reducing the distance between the sensing element and a finger, such as using an edge trench for arranging the bond pad on the sensing chip. In particular, using an edge trench takes up a certain area outside of the sensing area whereas the sensing device according to the invention offers a higher flexibility in locating the bond pads and thereby provides more efficient area utilization.

According to one embodiment of the invention, the adhesive may preferably have a thickness at least equal to the height of the portion of the bond wire protruding above the sensing plane. Since it is desirable to maintain a separation between the protective plate and the bond wire to reduce the risk of disturbances relating to ESD (electrostatic discharge) phenomena, an adhesive thicker than the loop height of the bond wire ensures that there is no contact between the bond wire and the protective plate.

In one embodiment of the invention, the adhesive may advantageously be an adhesive film comprising a first adhesive layer arranged in contact with the sensing elements, an intermediate carrier layer, and a second adhesive layer arranged in contact with said protective plate. The intermediate carrier layer acts to provide mechanical stability to the adhesive film while still being flexible. Thereby, if the thickness of the first adhesive layer is selected to be lower than the bond wire loop height, the intermediate carrier layer can act to push down on the bond wire when the film is being placed onto the sensing chip so that the wire bond loop height is reduced. This is advantageous since it provides a well defined device where the wire bond loop height is defined by the thickness of the first adhesive layer, the distance between the wire bond and the protective plate is defined by the thickness of the second adhesive layer and the thickness of the intermediate carrier layer, and the distance between the sensing plane and the protective plate is defined by the overall thickness of the tape. The aforementioned adhesive film may also be referred to as a double-sided adhesive film or a double-sided tape. Such double-sided tapes suitable for use in the present application having a high accuracy in thickness and uniformity are commercially available.

In one embodiment of the invention, the intermediate carrier layer may advantageously comprise a dielectric material. The adhesive is preferably insulating having high electric field breakdown strength. Accordingly, an adhesive having high electric field breakdown strength protects the sensing elements from electrostatic discharge.

According to one embodiment of the invention, the intermediate carrier layer may advantageously comprise a material having an electric field breakdown strength of at least 100 V/µm, and preferably of at least 200 V/µm. In principle, it is desirable to have an electric field breakdown strength which is as high as possible.

In one embodiment, the dielectric material may be a polyimide film. By using an intermediate carrier layer in the form of a dielectric film with high resistance to electric breakdown, the risk of ESD discharges reaching the bond wire is reduced, making it possible to reduce the distance between the bond wire and the protective plate, i.e. by reducing the thickness of the second adhesive layer of the adhesive tape. In principle, the thickness of the second adhesive layer is only limited by the adhesive properties meaning that the thickness must be sufficient to provide proper and reliable adhesion between the protective plate and the sensing chip. Polyimide is known to have advantageous ESD-properties.

According to one embodiment of the invention, the fingerprint sensing device may further comprise a frame arranged on the substrate and surrounding the sensing chip, the frame having a height from the substrate larger than a height of the sensing chip and a height lower than or equal to a combined height of the sensing chip and the adhesive; wherein the substrate bond pads are located between the sensing chip and the frame. The frame may be mechanically attached to the substrate by means of an adhesive such as a glue or tape.

In one embodiment of the invention, the fingerprint sensing device may further comprise a sealing material arranged between the frame and the protective plate, the sealing material being configured to seal a gap between the frame and the protective plate.

Moreover, in one embodiment of the invention, the fingerprint sensing device may further comprise a filling material arranged between the sensing chip and the frame, filling a space between the sensing chip and the frame. The frame acts as a barrier allowing the use of a filling material being dispensed in liquid form in the space formed between the frame and the chip. After distribution, the filling material is cured to provide protection of the bond wire and bond pads on the substrate. In particular, the physical connection of the bond wires to the bond pads of the substrate may be susceptible to damage from mechanical shocks if not properly embedded in a surrounding material. In order to enable the use of a liquid filling material, the frame is arranged along the entire periphery of the sensing chip so that the sensing chip is encircled by the frame.

In one embodiment of the invention, the adhesive may advantageously be arranged to cover said filling material. Thereby, the adhesive extends outside of the area of the sensing chip so that the bond wires are in principle fully embedded by the combination of the adhesive and the filling material. Accordingly, the risk of damage to the bond wires in case of mechanical shock or due to corrosion is further reduced. Moreover, by extending the adhesive to cover also the filling material, additional mechanical support and additional adhesion is provided for the protective plate, which also may extend outside of the area of the sensing chip. Ideally, the filling material reaches the full height of the sensing chip. In practice the filing material may however be slightly lower that the height of the sensing chip. For that reason, it may be advantageous to use an adhesive which is compressible so that the adhesive bulges down below the surface plane of the substrate in order to compensate for a difference in height between the filling material and the sensing chip. Thereby, the bond wires can be fully embedded by the adhesive and the filling material.

According to one embodiment of the invention, the frame may advantageously be bezel-shaped having an inner recessed ledge configured to receive the protective plate. Using a frame in the form of a bezel makes it easy to accurately place the protective plate in the bezel as the plate is limited in lateral movement when placed on the ledge of the bezel. The bezel also provides additional protection from dirt and moisture penetrating into the sensor at the gap between the protective plate and the surrounding surface.

A bezel may also be desirable for aesthetic purposes as it provides a frame surrounding the protective plate of the fingerprint sensor.

According to one embodiment of the invention, the protective plate may advantageously be mechanically attached to the frame so as to form an assembly comprising the protective plate and the frame. The protective plate may for example be fused or glued to the frame. The assembly may be mounted in place by means of the adhesive arranged on the sensing chip attaching the protective plate to the sensing chip. After arranging the assembly onto the sensing chip, there may be an air gap between the frame and the substrate, ether by design or in practice due to tolerances in the manufacturing process.

It may be advantageous to arrange an adhesive between the frame and the substrate both for mechanical adhesion and in order to seal a gap between the assembly and the sensing chip to eliminate the possibility of dirt and moisture reaching the sensing chip. An adhesive may for example be pre-arranged on the substrate when the assembly is being mounted, such that the frame of the assembly is attached to the substrate simultaneous with the protective plate of the assembly being attached to the sensing chip. Alternatively, an adhesive may be dispensed form the outside into an air gap formed between the frame and the substrate after mounting of the assembly. An angled dispenser may advantageously be used for dispensing an adhesive into such an air gap. By arranging an adhesive between the frame portion of the assembly and the substrate, the sensing chip is fully sealed by the assembly, thus ensuring that dirt and moisture cannot reach the bond wires or the sensing chip. Thereby, there is in principle no need to use a filling material between the sensing chip and the frame since the encapsulation will act to protect the bond wires form corrosion, dirt and/or moisture. The bond pads on the substrate and the bond bumps may be enclosed in a drop of an epoxy material, such as a "glob-top", to protect the bond from mechanical shock. By eliminating the need for a filling material between the sensor chip and the frame, a complicated and expensive manufacturing step can be avoided. Alternatively, in applications where a filling material is strictly required or desired, a filling material may be dispensed from the "backside", i.e. through an opening in the substrate. Further advantages related to mechanically attaching the protective plate to the frame will be discussed below in relation to a method for manufacturing a sensing device.

According to one embodiment of the invention, the frame may advantageously be electrically conductive in order to provide ESD protection for the fingerprint sensing device. An electrically conductive frame providing a conductive path to the substrate will act as a conductor for electrostatic discharges so that charge can be safely led away to prevent charge from reaching the bond wires and/or the sensing elements and the sensing chip where it may cause damage to components in the chip and in the readout circuitry. The frame may be electrically connected to the substrate for example by arranging the frame on a conductive portion of the substrate and by attaching the frame to the substrate with a conductive adhesive. The conductive adhesive may for example be a conductive epoxy material.

Moreover, the frame may be mechanically and electrically connected to the substrate by means of a combination of conductive and non-conductive adhesive. In order to achieve adequate ESD-protection, it may be sufficient to arrange a conductive adhesive only at select locations between the frame and the substrate, whereas the remaining portions may be filled with a non-conductive adhesive which is advantageous since a conductive adhesive is more costly than a non conductive adhesive.

According to one embodiment of the invention, the fingerprint sensing device may further comprise a plurality of bond wires arranged on the substrate, protruding from the substrate and in contact with the frame, such that an electrical connection is formed between the substrate and the frame by means of the bond wires. By arranging bond wires on the substrate, for example having a bond wire loop having a certain predetermined height above the substrate, an electrical connection may be formed between the frame and the substrate without the use of a conductive adhesive. If it is desirable to seal a gap between the frame and the substrate, a non-conductive adhesive may be used as described above.

In one embodiment of the invention the protective plate may advantageously have a different geometry from a geometry of the sensing chip. Since the adhesive may be arranged onto the sensing chip before the protective plate is mounted, it is not required that the protective plate has any specific geometry or size, i.e. the geometry of the protective plate is not dictated by the geometry of the sensing chip or of the adhesive, thereby allowing the use of a free-form protective plate. Accordingly, a fingerprint sensing device is provided where the protective plate can be made to have any shape and size suitable for the particular application without the need to modify any active portions of the sensor.

According to one embodiment of the invention, the fingerprint sensing device may further comprise a frame being an integral part of the protective plate, the frame extending from the protective plate towards the substrate to encircle the sensing chip such that the substrate bond pads are located between the sensing chip and the frame. That the frame is an integral part of the protective plate should be interpreted to mean that the protective plate and the frame is made in one piece from one and the same material. The plate and frame may for example be made from a ceramic or glass material which may be molded or etched to provide the desirable shape. Select portions of the frame and or/protective plate may subsequently be metallized to provide desired ESD deflection properties. Metallization can be performed using conventional metallization techniques known by the skilled person.

In one embodiment of the invention, the fingerprint sensing device may further comprise a plurality of charge amplifiers, one charge amplifier connected to each of the sensing structures, for providing a sensing signal indicative of a change of a charge carried by the sensing structure resulting from a change in a potential difference between the finger and the sensing structure.

According to a second aspect of the invention, there is provided a method of manufacturing a fingerprint sensing device, the method comprising the steps of: providing a sensing chip comprising a plurality of sensing elements having a surface defining a sensing plane, each sensing element being configured to provide a signal indicative of an electromagnetic coupling between the sensing element and a finger placed on an exterior surface of the fingerprint sensing device; arranging the sensing chip on a substrate comprising readout circuitry; performing wire bonding to connect bond pads of the sensing chip to corresponding bond pads of the substrate by means of bond wires, wherein a portion of each bond wire protrudes above the sensing plane; arranging an adhesive on the sensing chip to cover said sensing chip, such that the portion of each bond wire protruding above the sensing plane is embedded in the adhesive; arranging a protective plate on the adhesive film, such that the protective plate is attached to the sensing chip, said protective plate forming an exterior surface of the fingerprint sensing device.

Many of the effects and features of the second aspect of the invention are largely analogous to those described above in connection with the first aspect of the invention. However, particular advantages relating to the manufacturing method will be further discussed in the following sections.

An advantage of the claimed manufacturing method is that the adhesive is arranged onto the sensing chip, having the effect that the geometry of the adhesive does not have to match the geometry of the protective plate. Thereby, the shape of the protective plate can be selected independently enabling the use of a free-form protective plate. In comparison, known manufacturing methods often utilize a lamination technique where an adhesive is laminated onto a full wafer or a larger substrate and where a plurality of protective plates are subsequently formed from the wafer. Traditional sawing techniques will then limit the geometry of the protective plate to squares or rectangles.

According to one embodiment of the invention, the step of arranging an adhesive may advantageously be performed at a temperature above the glass-liquid transition temperature, $T_g$, of the adhesive. Thereby, the adhesive is sufficiently soft (without being free flowing) so as to easily enclose the bond wire when the adhesive is being placed onto the sensing chip. Moreover, the adhesive may also be arranged to extend outside of the sensing chip, as discussed above in relation to various embodiment of the invention.

According to a third aspect of the invention, there is provided a method of manufacturing a fingerprint sensing device, the method comprising the steps of: providing a sensing chip comprising a plurality of sensing elements having a surface defining a sensing plane, each sensing element being configured to provide a signal indicative of an electromagnetic coupling between the sensing element and a finger placed on an exterior surface of the fingerprint sensing device; arranging the sensing chip on a substrate comprising readout circuitry; performing wire bonding to connect a bond pad of the sensing chip to a corresponding bond pad of the substrate by means of a bond wire, wherein a portion of the bond wire protrudes above the sensing plane; arranging an adhesive on the sensing chip in contact with the sensing elements such that the portion of the bond wire protruding above the sensing plane is embedded in the adhesive, forming a cover comprising a protective plate portion and a frame portion protruding from the protective plate; the frame portion being configured to surround the sensing chip when the cover is arranged on the sensing chip and the substrate, arranging the cover on the sensing chip and the substrate such that the protective plate portion is attached to the sensing chip by means of the adhesive.

Additional effects and features of the third aspect of the invention are largely analogous to those described above in connection with the first and second aspects of the invention.

Further features of, and advantages with, the present invention will become apparent when studying the appended claims and the following description. The skilled person realize that different features of the present invention may be combined to create embodiments other than those described in the following, without departing from the scope of the present invention.

BRIEF DESCRIPTION OF THE DRAWINGS

These and other aspects of the present invention will now be described in more detail with reference to the appended drawings showing an example embodiment of the invention, wherein.

DETAILED DESCRIPTION OF PREFERRED EMBODIMENTS OF THE INVENTION

In the present detailed description, various embodiments of a fingerprint sensing device according to the present invention are mainly discussed with reference to a capacitive fingerprint sensing device. A method for manufacturing a fingerprint sensing device is also discussed.

Figure 1:
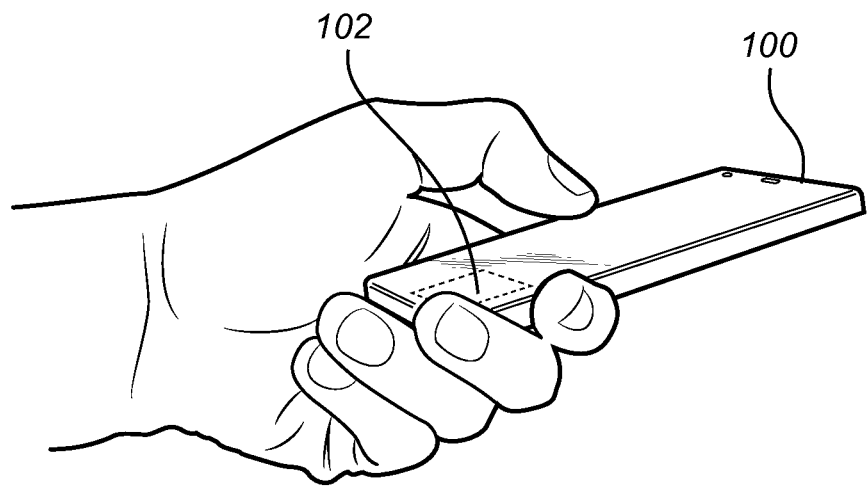
FIG. 1 schematically illustrates a handheld electronic device comprising a fingerprint sensing device according to an embodiment of the invention.

FIG. 1 is a schematic illustration of a handheld device 100 comprising a fingerprint sensing device 102. A fingerprint sensing device 102 can be used in for example a mobile phone, a tablet computer, a portable computer or any other electronic device requiring a way to identify and/or authenticate a user.

Figure 2A:
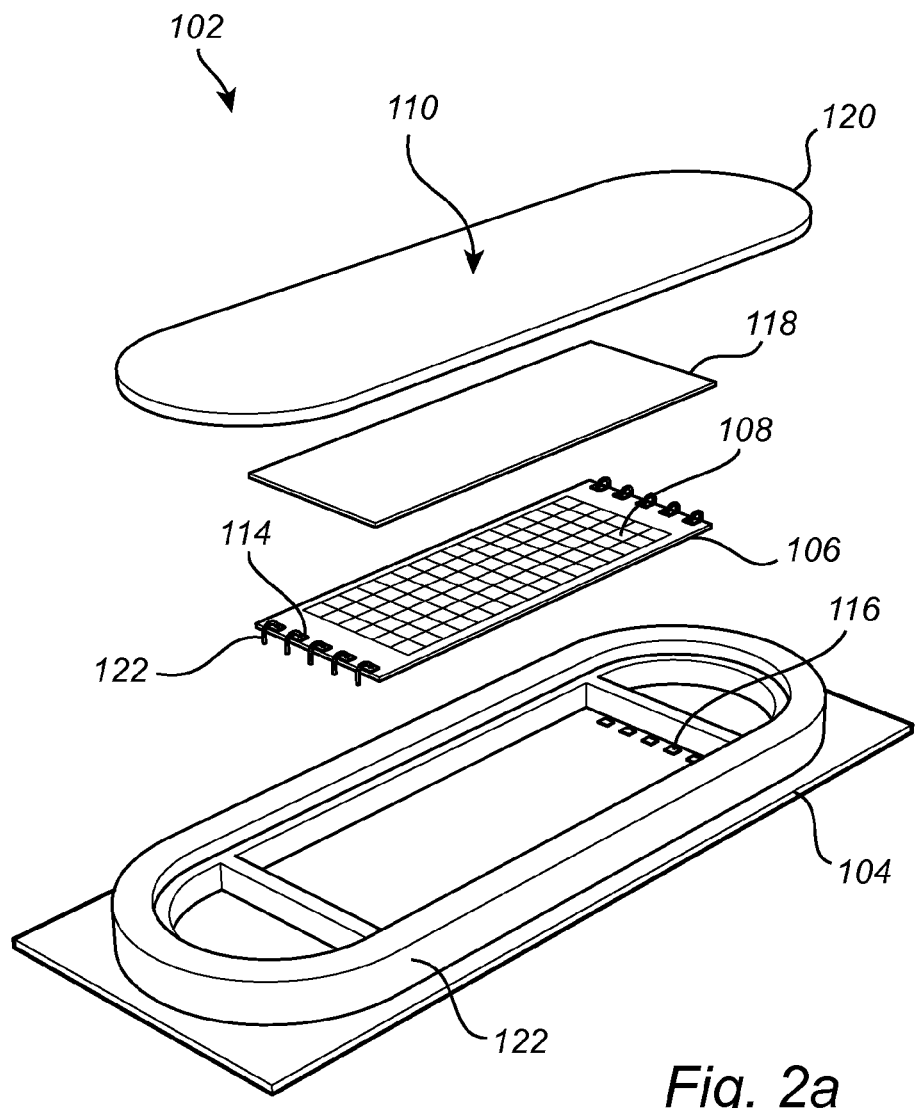
FIGS. 2a-b schematically illustrates a fingerprint sensing device according to an embodiment of the invention.

FIG. 2a is a schematic illustration in the form of an exploded view of a fingerprint sensing device 102 comprising a substrate 104. The substrate comprises readout circuitry (not shown) for reading information provided by the fingerprint sensing chip 106 which is arranged on the substrate 104. The substrate 104 may be a conventional printed circuit board (PCB), a flexible substrate, or any other type of substrate or carrier suitable for use in the application at hand.

The sensing chip 106 further comprises a plurality of sensing elements 108 having a surface defining a sensing plane. Each sensing element 108 is configured to provide a signal indicative of an electromagnetic coupling between the sensing element and a finger placed on the exterior surface 110 of the fingerprint sensing device 102. The signal is provided to the readout circuitry of the substrate by means of a plurality of bond wires 112 arranged between a set of respective first bond pads 114 located on the sensing chip 106 and a set of respective second bond pads 116 located on the substrate 104, thereby electrically connecting the sensing chip 106 to the readout circuitry of the substrate 104.

Figure 2B:
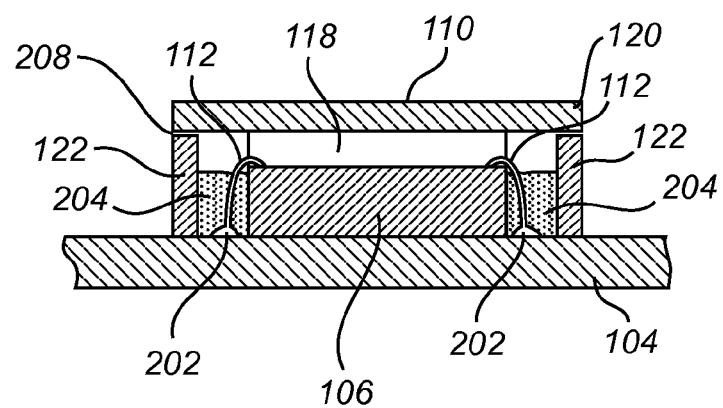

As can be seen in FIG. 2a, and in more detail in the cross-section view in FIG. 2b, a portion of each bond wire 112 protrudes above the sensing plane of the sensing chip 106. Illustrated in FIG. 2b is a so called reverse wire bond where the bond bump 202 is located on the substrate 104 and not on the sensing chip 106. Accordingly, a reverse wire bond may facilitate a lower overall wire bond loop height. However, various advantages of the invention are equally applicable in embodiments where other types of wire bonds are used. FIGS. 2a and 2b further illustrate an adhesive 118 for mechanically attaching the protective plate 120 to the sensing chip 106. In FIG. 2a the adhesive is illustrated as having the same size and shape as the sensing chip 106 and in FIG. 2b the adhesive is arranged to cover the sensing chip 106 so that a portion of the bond wires 112 protruding above the sensing plane is embedded in the adhesive. In FIG. 2b, it can be seen that the portion of the bond wire 112 which is embedded in the adhesive 118 is the portion of the wire which is directly above the sensing chip 106. The adhesive 118 has a thickness which is larger than the bond wire 112 loop height to avoid that the bond wire 112 comes into contact with the protective plate 120. The protective plate 120 may constitute any type of insulating material such as a ceramic material, $SiO_2$, $ZrO_2$, sapphire or chemically strengthened glass which is suitable for use as a top layer forming a surface in a fingerprint sensing device.

FIG. 2b further illustrates a filling material 204 arranged in the space between the sensing chip 106 and a surrounding frame 122. The filling material 204 acts to protect the bond wire 112 and the bond bump 202 from contaminants and moisture which may lead to corrosion, and to make the bond more resilient to mechanical shock. That the frame 122 fully surrounds and encircles the sensing chip 106 as illustrated in FIG. 2a means that the filling material 204 may be provided in liquid form which in turn ensures good filing properties in that the space is completely filled. Even though the space between the sensing chip 106 and the frame 122 is illustrated as one continuous space, the space may equally well be divided into compartments which may be separately filled with a filling material 204. Due to inaccuracies in the manufacturing process, it may not be possible to manufacture the frame 122 to be exactly the same as the combined height of the sensing chip 106 and the adhesive 118. Therefore, the frame 122 may be manufactured to ensure that the frame height does not exceed the combined height of the sensing chip 106 and the adhesive 118, thereby possibly leaving a small gap 208 between the frame 122 and the protective plate 120. The frame 122 may sometimes be referred to as a bezel.

The frame 122 is preferably made from a conductive material so that it can act to protect the sensing chip 106 and bond wires 112 from electrostatic shock discharge (ESD). An electrostatic charge being built up between a finger and the surface 110 of the sensing device 102 will then be guided by the conductive frame 122 down to the substrate 104 where the frame is connected to one or more electrodes of the substrate 104 having a known potential, such as ground potential, or to dedicated ESD circuitry.

Figure 3:
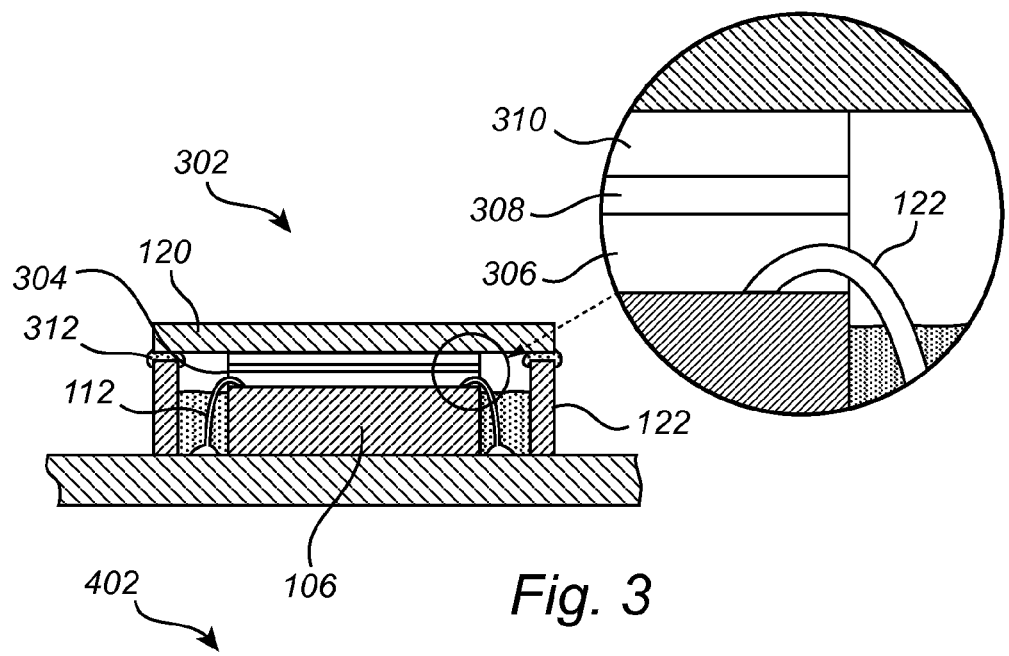
FIG. 3 schematically illustrates a fingerprint sensing device according to an embodiment of the invention.

FIG. 3 schematically illustrates a fingerprint sensing device 302 which in many respects is similar to the device 102 of FIG. 2b. However, in FIG. 3 the adhesive is provided in the form of an adhesive film 304 comprising three layers. The adhesive film 304 may also be referred to as an adhesive tape, and in particular to a double-sided adhesive tape. The adhesive film 304 comprises a first adhesive layer 306 arranged in contact with the surface of the sensing chip 106, an intermediate carrier layer 308 and a second adhesive layer 310 arranged in contact with the protective plate 120. When an adhesive film of the aforementioned type is used, the first adhesive layer 306 can be selected to have a thickness which is less than the wire bond loop height. The intermediate carrier layer 308 will then act to push down on the bond wire 112 when the adhesive film 304 is being placed onto the sensing device 106 so that the wire bond loop height is reduced. Thereby, the overall thickness of the adhesive may be reduced which in turn reduces the distance between a finger placed on the surface 110 of the sensing device and the sensing elements leading to a better capacitive coupling. Furthermore, the adhesive may advantageously have a high dielectric constant to further enhance the capacitive coupling between a finger and the sensing elements.

In a practical example, the bond wire loop height is 50 µm with a tolerance of ±20 µm and the first adhesive layer 306 has a thickness of 40 µm. The intermediate carrier layer 308 is preferably sufficiently flexible to allow the carrier layer 308 to flex somewhat when in contact with the bond wire 112 while being sufficiently rigid to prevent the bond wire 112 from being too close to or reaching the protective plate 120. Even though the following example embodiments will be discussed mainly with reference to an adhesive in the form of an adhesive film 304 comprising an intermediate carrier layer 308, many of the advantages and features of the example embodiments are equally applicable when using a single layer adhesive.

Furthermore, the intermediate carrier layer can comprise a dielectric material, and the dielectric material preferably has an electric field breakdown strength of at least 100 V/μm, and more preferably of at least 200 V/μm. An intermediate carrier layer 308 made from a dielectric material will reduce the risk of ESD reaching the sensing device through the adhesive film 304. Instead, any electrostatic charge will have a higher likelihood to be deflected and to discharge via the conductive frame 122 surrounding the sensing device 106, which provides a path of lower resistance to the substrate 104. In particular, a discharge form a finger located on or near the surface 110 of the protective plate 120 is more likely to go through the air on the side of the protective plate 120 to reach the frame 122, since air has an electric field breakdown strength which is significantly lower than that of the protective plate 120 and carrier layer 308 of the adhesive film 304. The dielectric material of the carrier layer 308 may for example be polyimide which is known to have a high electric field breakdown strength and thereby advantageous ESD-properties.

FIG. 3 further illustrates a sealing material 312 arranged in the gap 208 between the protective plate 120 and the frame 122, which acts to seal the device so that the sensing chip 120 and the bond wires 112 is fully encapsulated by the frame 122 and the protective plate 120. The sealing material 310 may for example be an epoxy material which is arranged on the frame 122 prior to mounting the protective plate 120.

Figure 4:
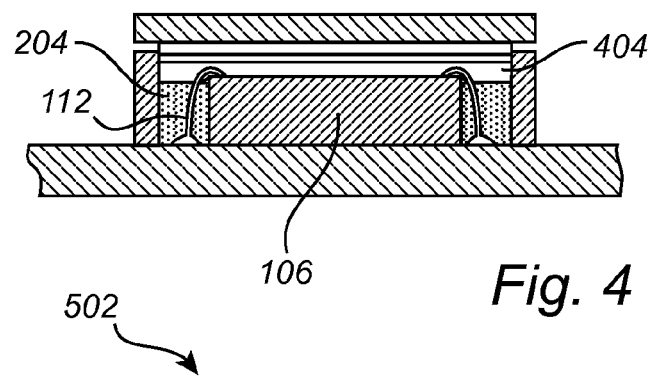
FIG. 4 schematically illustrates a fingerprint sensing device according to an embodiment of the invention.

FIG. 4 illustrates a fingerprint sensing device 402 where the adhesive film 404 extends outside of the area of the sensing chip 106 to also cover at least part of the filling material 204. As can be seen from FIG. 4, the bond wire 112 is nearly completely enclosed by the adhesive 306 and by the filling material 204 so that the entirety of the bond wire 112 is nearly completely protected from contaminants, corrosion and mechanical damage. The adhesive film 404 can also be made to be slightly compressible so that the first adhesive layer 306 bulges down below the surface plane of the sensing chip 106 as illustrated in FIG. 4, thereby embedding an even lager portion of, or all of, the bond wire 122 in case the filling material 204 does not fully reach the height of the sensing chip 106. This may occur when there are inaccuracies in the manufacturing process, such as when the filling material 204 is being dispensed. In embodiments where the filling material is dispensed prior to arranging the adhesive layer on the sensing device 106, the filling material 204 may be deliberately provided to not fully reach the height of the sensing chip 106 to ensure that no filling material 204 ends up on the sensing elements 108 of the sensing chip 106.

Figure 5:
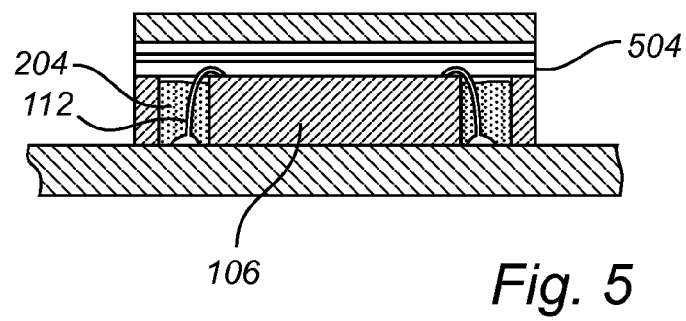
FIG. 5 schematically illustrates a fingerprint sensing device according to an embodiment of the invention.

FIG. 5 schematically illustrates an embodiment of a fingerprint sensing device 502 where the adhesive 504 is arranged to extend outside of the sensing chip area 106 and also outside of the filling material 204 to cover both the filling material 204 and the frame 122. The frame 122 may then provide additional mechanical support for and better adhesion of the protective plate due to the larger area portion of the protective plate being supported and attached. Furthermore, using a compressible adhesive may alleviate manufacturing inaccuracies of the frame height since the adhesive may be in contact with the frame 122 even if the frame 122 is slightly below the sensing chip 106 surface.

Figure 6:
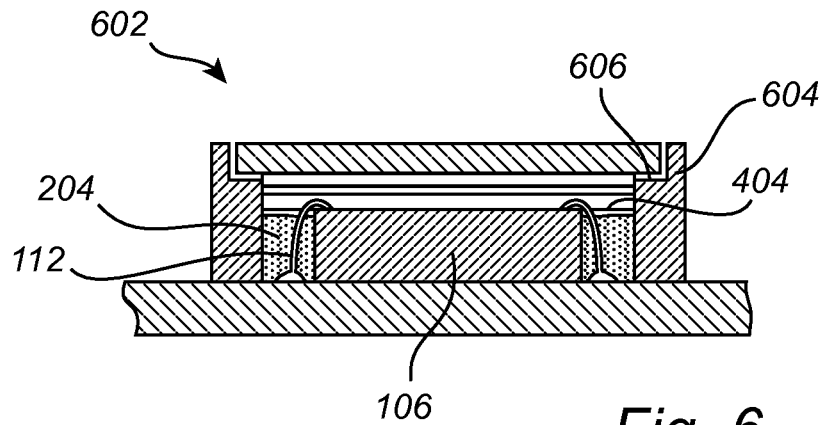
FIG. 6 schematically illustrates a fingerprint sensing device according to an embodiment of the invention.

FIG. 6 schematically illustrates an embodiment of a fingerprint sensing device 602 with a bezel-shaped frame 604 having a ledge 606 configured to receive the protective plate 120. Such a frame 604 with a receiving ledge 606 may be referred to as a bezel 604. Using a bezel has the effect that the fingerprint sensor may be surrounded by a visible frame which is sometimes desirable for aesthetic reasons. Moreover, the bezel 604 provides additional protection for the bond wires 112 since it is more difficult for contaminants and moisture to reach the bond wires 112. An additional advantage of using a bezel is that potential ESD more easily reaches the conductive bezel 604, thereby providing improved ESD-protection.

Figure 7:
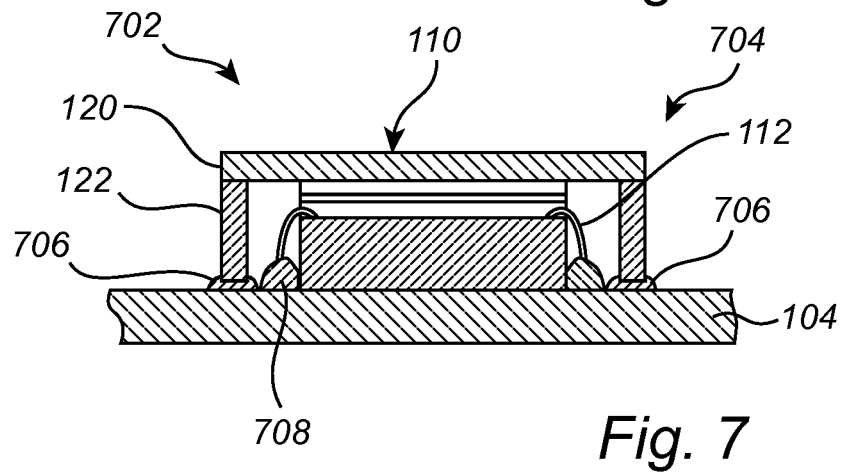
FIG. 7 schematically illustrates a fingerprint sensing device according to an embodiment of the invention.

FIG. 7 schematically illustrates a sensing device 702 where the protective plate 120 and the frame 122 are joined together to form an assembly 704. Typically, the assembly 704 is formed prior to mounting the assembly 704 onto the substrate 104 and the sensing chip 106. The frame 122 and the protective plate may for example be fused or glued together to form the assembly 704. Even though the assembly 704 is illustrated as consisting of two separate members, the frame 122 and the protective plate 120, it is also possible to form the assembly from one piece of material, for example by molding, so that the frame is an integral part of the protective plate. FIG. 7 further illustrates a sealing material 706 arranged between the frame 122 of the assembly 704 and the substrate 104. The sealing material 706 can either be pre-deposited on the substrate 104 prior to mounting the assembly 704, or it may be dispensed after the assembly 704 has been mounted using an angled dispenser. It should also be pointed out that the assembly 704 is predominantly adhering to the sensing chip 106 by means of the adhesive 118 arranged between the sensing chip 106 and the protective plate 120 portion of the assembly 704.

By means of the sealing material 706, the space between the frame 122 and the sensing chip 106 where the bond wires 112 are located can be fully and hermetically sealed, thereby ensuring that no contaminants or moisture can reach the bond wires 112. Thus, there is no need for a filling material thereby providing a simpler manufacturing process. However, there may still be a need to protect the bond wires 11 from damage resulting from mechanical shock, in particular at the location where the bond wire 112 meets the substrate 104, i.e. at the bond bump 202. Such protection can be achieved in the by depositing a sealing material 708 surrounding the bond bump 202. The sealing material 708 may for example be an epoxy material, such as a glob-top coating. To provide a good electrical connection between the frame and the substrate for ESD purposes, the sealing material 706 advantageously comprises a conductive material, such as a conductive epoxy. It may also be possible to use a conductive sealing material only at select locations along the circumference of the frame, which locations may then coincide with connection pads on the substrate 104 connected to ground or to dedicated ESD-circuits. The remaining portions may then be filled with a non-conductive sealing material. Alternatively, or in combination, the substrate 104 may be provided with bond wires and/or bond wire loops (not shown) protruding from the substrate 104 at select locations so that the frame 122 makes electrical contact with the substrate 104 via the bond wire loops. The loops should protrude sufficiently high above the substrate 104 so that they are depressed by the frame when the frame is being mounted, so as to ensure sufficient contact. Thereby, the frame 122 may be electrically connected to ground or ESD-circuitry without the need for a conductive sealing material.

Furthermore, using an assembly 704 alleviates potential problems relating to processing variations of the different components used. In practice it may be difficult and/or costly to control the height of the frame 122 to a sufficient degree of accuracy. By using an assembly 704 and a sealing material 706 between the frame and the substrate 104 as described above, optimal coupling between the protective plate 120 and the sensing chip 106 is enabled since there is no need to take manufacturing tolerances of the frame 122 into account. Using an assembly 704 also provides advantageous ESD-properties due to the coupling between the frame 122 and the substrate 104 and due to the minimized distance between the surface 110 of the protective plate and the frame 122.

Figure 8:
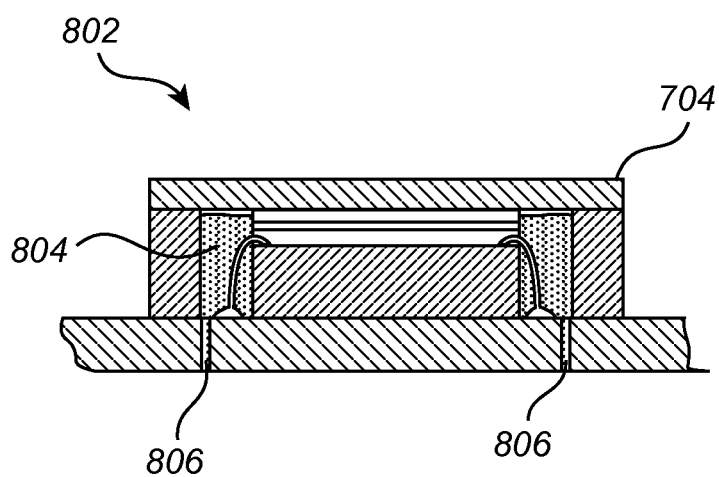
FIG. 8 schematically illustrates a fingerprint sensing device according to an embodiment of the invention.

Even though it is possible to achieve fully enclosed bond wires by using an assembly as described above, it may still be desirable to use a filling material in the space between the frame and the sensing chip 106. FIG. 8 schematically illustrates a fingerprint sensor device 802 where a filling material 804 can be provided from the backside of the device via openings 806 in the substrate 104. The openings 806 are arranged so that they do not intersect the bond pads of the substrate 104.

An example configuration 904 of the sensing elements 108 comprised in above-described embodiments of the fingerprint sensor will now be described with reference to FIGS. 9a-b. For clarity, the adhesive layer and protective plate of the sensing device are not shown.

Figure 9A:
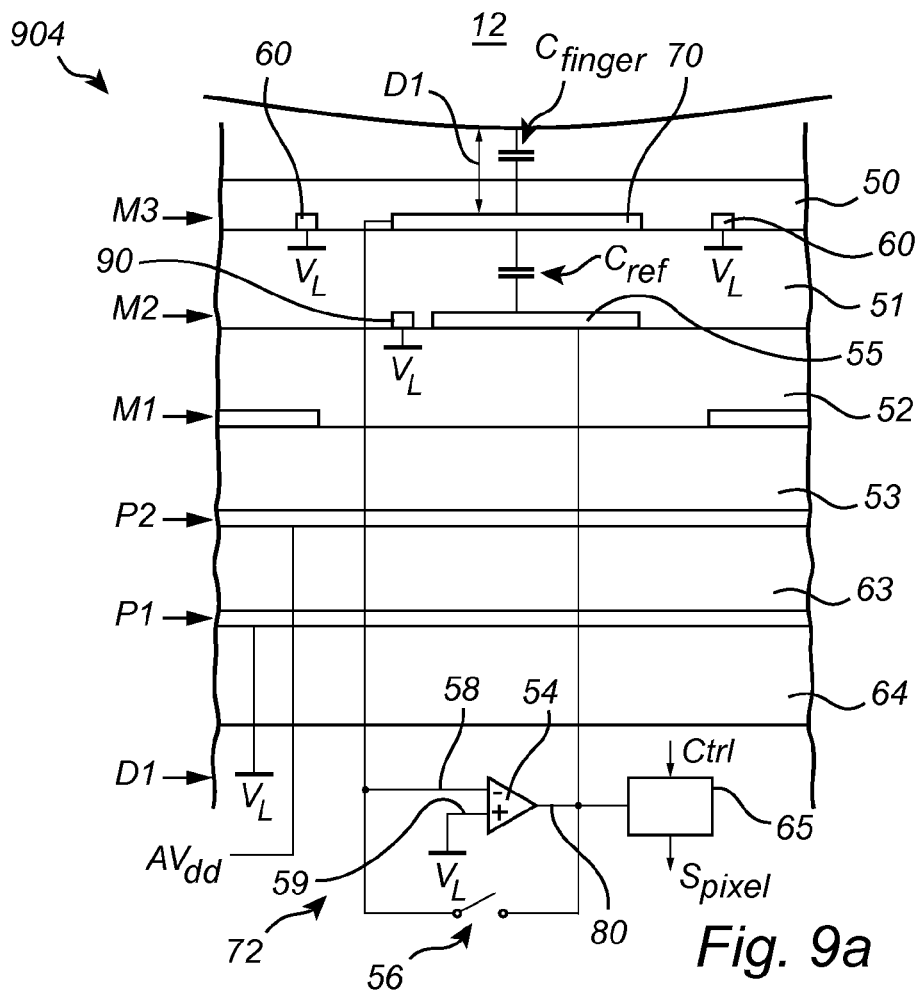
FIGS. 9a-b schematically illustrate example configurations of sensing elements comprised in embodiments of the fingerprint sensing system according to the present invention.
Figure 9B:
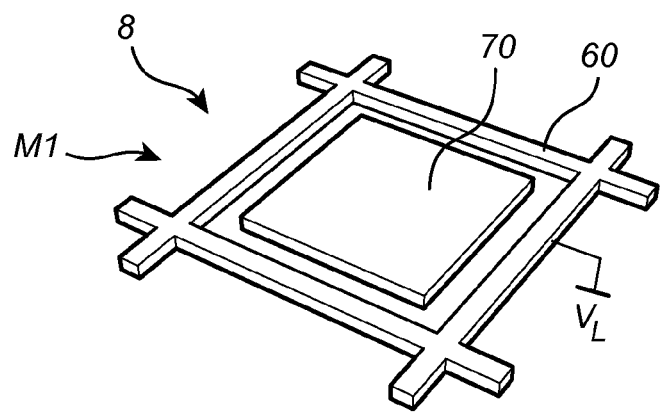

As can be seen in FIG. 9a, the sensing elements 108 are formed in a layer structure comprising three conductive layers; a conductive layer M3 at the top, a conductive layer M2 in the middle and a lower conductive layer M1, with first 51, second 52, and third 53 layers of an insulating dielectric material under the respective conductive layers M3, M2, M1, and an insulating layer 50 arranged over the conductive layer M3. Examples of materials for the conductive layers are typically copper, aluminum and doped polycrystalline silicone. Examples of materials for the insulating layers are typically SiO2, SiN, SiNOx and spin-on glass.

In addition, the layered structure used to form the sensing elements 108 may comprise a fourth layer P2 (second polysilicon) constituted by an electrically conducting layer which is kept at a certain analog voltage potential $AV_{dd}$ in relation to sensor ground $V_L$. Further, there is a fifth layer P1 (first polysilicon) that is also constituted by an electrically conducting layer which is kept at sensor ground potential $V_L$, working as an electric shielding. Under each one of these layers P2, P1 there are fourth 63 and fifth 64 layers of an insulating dielectric material. At the bottom, there is a semi conductive substrate layer D1 comprising active components such as the charge amplifiers 54. The conductive layers P2, P1 as well as the lower conductive layer M1 described above, may for example be used for routing of electrical connections, resistors and electrical shielding. One of the conductive layers P2, P1 may also be used to form the lower electrode 55 of each sensing element 904 instead of the second metal layer M2.

The sensing element 108 shown in FIG. 9a comprises a sensing structure 70 formed in the top conductive layer M3. The sensing structure 70 is connected to a sensing element circuit 72 comprising a charge amplifier 54, a lower electrode 55, a reset switch 56, and sample-and-hold circuitry 65.

As can be seen in FIG. 7a, the sensing structure 70 is connected to the negative input terminal 58 of the charge amplifier 54. The positive input terminal 59 of the charge amplifier 54 is connected to the sensor ground potential W. Hence, by means of the charge amplifier 54, the corresponding sensing structure 70 is virtually grounded (sensor ground), since the voltage over the input terminals 58, 59 of the charge amplifier 54 is almost zero. Depending on the circuit implementation of the charge amplifier there may be a small substantially constant voltage, such as the gate voltage of a CMOS transistor, between the negative 58 and positive 59 input terminals of the operational amplifier.

As can also be seen in FIG. 7b, each sensing structure 70 may be surrounded by a shield frame 60 formed in the top conductive layer M3, where the shield frame 60 is connected to the sensor ground potential $V_L$ as a conductive shielding to prevent lateral parasitic capacitances between adjacent sensing structures 15b, thus preventing or at least reducing so-called crosstalk between the sensing elements 104. The shield frame 60 may also be connected to another suitable potential.

Further, referring again to FIG. 7a and to FIG. 2a, there is a cover structure 14 covering each of the sensing structures 70, to protect the sensing elements 108 from ESD (Electrostatic Discharge) and external wear. The cover structure is herein described as comprising the adhesive 118 and the protective plate 120. A finger 12 that comes into the vicinity of the upper surface 110 of the protective plate 120 gives rise to a capacitance $C_{finger}$ between the finger 12 and the sensing structure 70.

As can be seen in FIG. 7a, the lower electrode 55 comprised in the sensing element circuit 72 is formed in the middle conductive layer M2. The lower electrode 55 is connected to an output terminal 80 of the charge amplifier 54. There is a feedback capacitance $C_{ref}$ formed between the sensing structure 70 and each lower electrode 55, which feedback capacitance $C_{ref}$ is connected between the negative input terminal 58 of the charge amplifier 54 and the output terminal 80.

An auxiliary lower electrode 90 is also formed in the middle conductive layer M2, adjacent to the lower electrode 55. The auxiliary lower electrode 90 is connected to the sensor ground potential $V_L$ and used as an extra shielding, since the lower electrode 55 may typically have a smaller area than the sensing structure 70.

The lower electrode 55 may be configured to achieve the desired gain for the sensor element circuit 72. In particular, the size of the lower electrode 55 may be suitably selected, since the gain depends on the feedback capacitance $C_{ref}$, which in turn is dependent on the physical dimensions of the sensing structure 70, the lower electrode 55, and the first insulating layer 51. The size of the auxiliary lower electrode 90 may be adjusted so as to fit beside the lower electrode 55.

As described above, swinging the sensor ground potential $V_L$ in relation to the potential of the finger 12 will result in a change in the voltage between each sensing structure 70 and the finger 12, which will in turn result in a change of the charge carried by the sensing structures 70.

The change of charge that is carried by the sensing structure 70 is proportional to the capacitance $C_{finger}$ between the skin and the sensing structure 70. As the sensing structure 70 is virtually grounded in relation to sensor ground $V_L$, its charge is transferred by the charge amplifier 54 to the lower electrode 55. We may then calculate the voltage output from the charge amplifier 54 as:

$$U_{out}=(C_{finger}/C_{ref})U_{in}$$

The output voltage $U_{out}$ is sampled by the sample-and-hold circuitry 65, preferably using correlated double-sampling to remove the low frequency component of the common mode noise.

The sample-and-hold circuitry 65 is controlled by a control signal and outputs the pixel signal $S_{pixel}$ indicative of the capacitive coupling between sensing structure 70 and finger 12 to an analog-to-digital converter (not shown).

FIGS. 10-12 schematically illustrate methods of manufacturing a fingerprint sensor device according to various embodiments of the invention. The methods of manufacturing will be illustrated with reference to an adhesive film 304 comprising three layers, a first adhesive layer 306, an intermediate carrier layer 308 and a second adhesive layer 310. However, as the skilled person readily realizes, the described manufacturing methods are equally applicable using a single layer adhesive material.

Figure 10A:
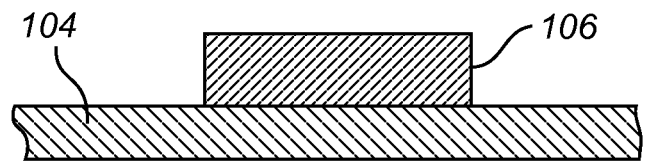
FIGS. 10a-d schematically illustrate a method of manufacturing a fingerprint sensing device according to an embodiment of the invention.
Figure 10B:
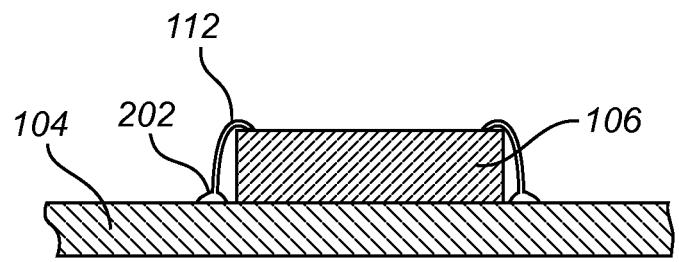
Figure 10C:
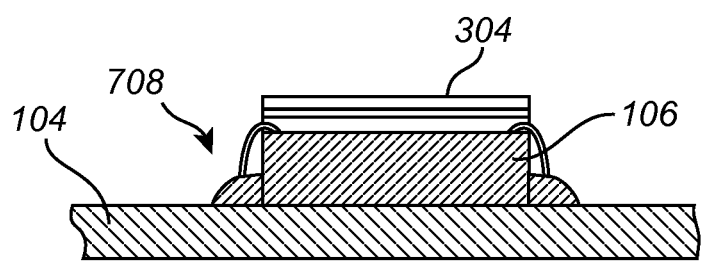
Figure 10D:
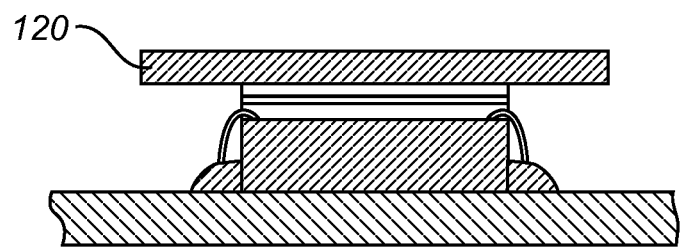

First, in FIG. 10a, a sensing chip 106 comprising a plurality of sensing elements is arranged on a substrate 104 by means of an adhesive, which for example may be an adhesive film or tape. Next, as illustrated in FIG. 10b, wire bonding is performed to connect the sensing elements of the sensing chip 106 to readout circuitry on the substrate 104. Reverse wire bonding is used so that the bond bumps 202 are located at the substrate, which helps to reduce the height of the wire bond at the sensing chip 106. In FIG. 10c, a protective sealing material 708 is arranged to cover the bond bumps 202 on the substrate 104 and an adhesive film 304 is arranged on the sensing chip. Finally, in FIG. 10d, the top protective plate 120 is arranged on the sensing ship 106 and in contact with the adhesive film 304. The adhesive film 304 is applied in a heated stage where the film is heated above the glass transition temperature $T_g$ of the adhesive so that the first and second adhesive layers, 306, 310, of the film start to flow. Hence, the portion of the bond wires 112 protruding above the surface of the sensing chip 106 are readily embedded in the first adhesive layer 106 when the adhesive film 304 is being placed on the sensing chip 106. The protective plate 120 is placed on the adhesive film 304 at the same heated stage and a post curing step is subsequently performed where the adhesive film 304 is cured for one hour in 130° C.

Figure 11A:
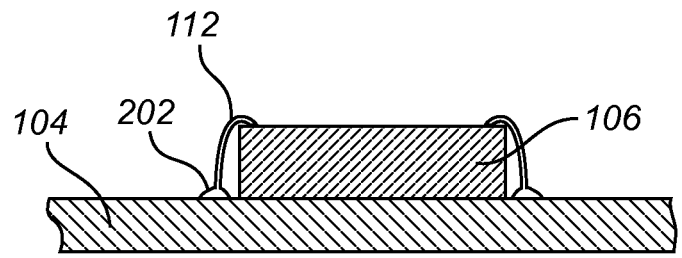
FIGS. 11a-d schematically illustrate a method of manufacturing a fingerprint sensing device according to an embodiment of the invention.
Figure 11B:
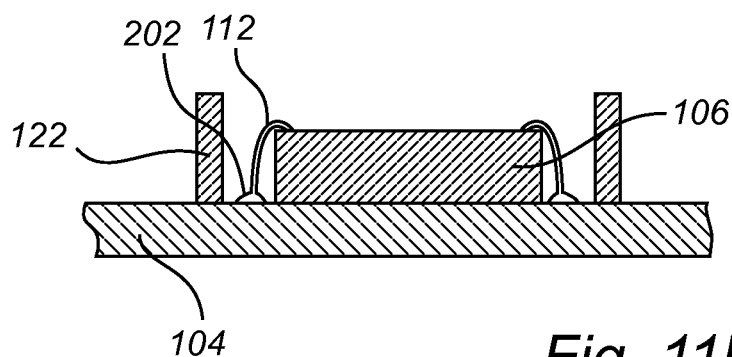
Figure 11C:
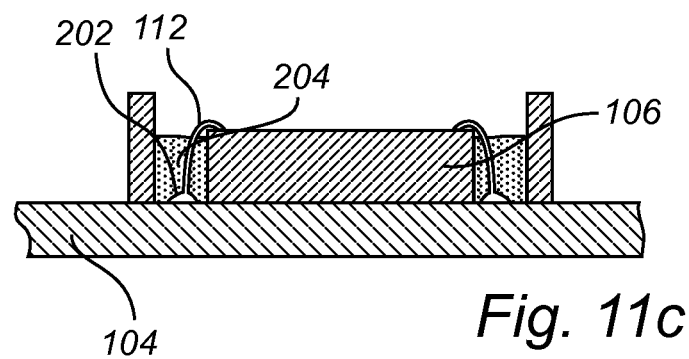
Figure 11D:
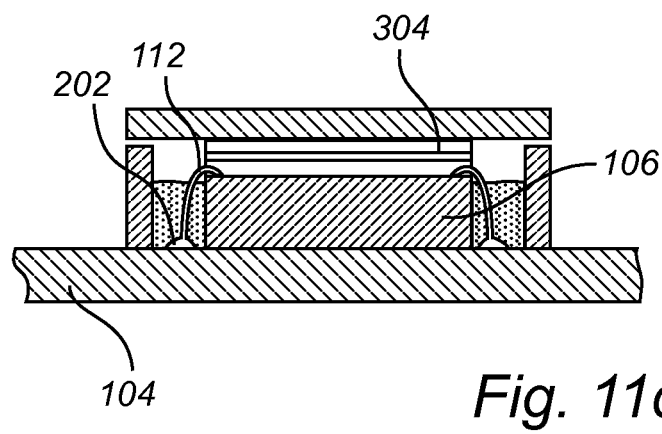

In the manufacturing method illustrated in FIGS. 11a-d, the steps discussed in relation to FIGS. 10 a-b are preformed in the same manner, as illustrated by FIG. 11a which is the same as FIG. 10b. Next, a frame 122 is arranged to surround the sensing chip. The frame 122 is attached to the substrate 104 using a conductive or non-conductive adhesive, or a combination thereof, as discussed above. Next, in FIG. 11c, a filling material 204 is dispensed in the space between the frame 122 and the sensing chip to protect the bond wires 112. Finally, in FIG. 11d, an adhesive film is arranged on the sensing chip 106 and the top protective plate 120 is arranged on the sensing ship 106 and in contact with the adhesive film 304.

It is important that the frame is not higher than the combined height of the sensing chip 106 and the adhesive film 104 since this may lead to insufficient adhesion between the protective plate and the sensing chip 106. Due to manufacturing inaccuracies of the frame 122, the frame 122 is in practice made so that it is certain that the height of the frame is less than the combined height of the sensing chip 106 and the adhesive film 304. Thereby, there may be a small gap between the frame 122 and protective plate 120.

Figure 12A:
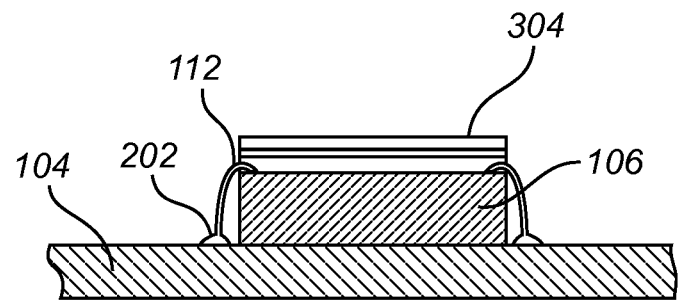
FIGS. 12a-c schematically illustrate a method of manufacturing a fingerprint sensing device according to an embodiment of the invention.

FIGS. 12 a-c schematically illustrates a manufacturing process using an assembly 704 comprising a frame portion 122 and a protective plate portion 120. FIG. 12a illustrates a sensing chip 106 arranged on a substrate 104 with bond wires 112 connecting the sensing chip to the substrate. The manufacturing steps are performed in the same manner as discussed in relation to FIGS. 10 and 11.

Figure 12B:
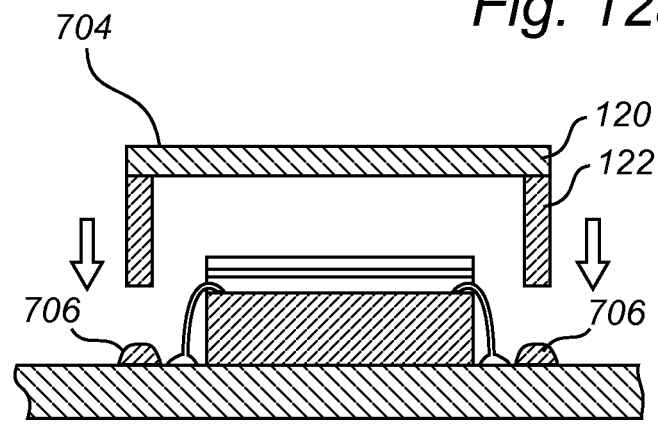

In FIG. 12b, the assembly 704 is arranged onto the sensing chip 106 and substrate 104. Adhesion of the frame is primarily achieved between the protective plate 120 and the sensing chip 106 by means of the adhesive film 304.

Figure 12C:
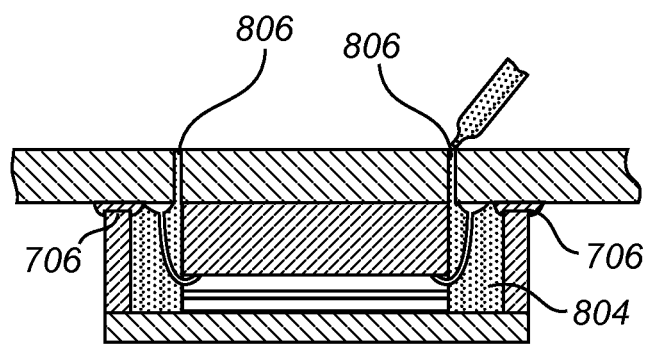

FIG. 12c illustrates dispensing a liquid filling material 804 into the enclosed space formed by the sensing chip 106, the assembly 704 and the substrate 104. However, the use of a filing material 804 is in principle optional since the bond wires 112 are fully encapsulated and thereby protected by means of the assembly 704 and the sealing material 706. To protect the bond bumps 202, a sealing material 708 may be used as illustrated in FIG. 7 and FIG. 10c.

Even though the invention has been described with reference to specific exemplifying embodiments thereof, many different alterations, modifications and the like will become apparent for those skilled in the art. Also, it should be noted that parts of the device may be omitted, interchanged or arranged in various ways, the sensor device yet being able to perform the functionality of the present invention.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

The invention claimed is:

1. A fingerprint sensing device comprising:
   a substrate comprising readout circuitry;
   a sensing chip arranged on said substrate, said sensing chip comprising a plurality of sensing structures each having a sensing element, wherein a surface of said sensing elements defines a sensing plane, each sensing element being configured to provide a signal indicative of an electromagnetic coupling between said sensing element and a finger placed on an exterior surface of the fingerprint sensing device;
   a bond wire arranged between a first bond pad located on said sensing chip and a second bond pad located on said substrate to electrically connect said sensing chip to said readout circuitry, wherein said first bond pad is located in said sensing plane and wherein a portion of said bond wire protrudes above said sensing plane;
   an adhesive arranged on said sensing chip to cover said sensing chip such that a portion of said bond wire protruding above said sensing plane is embedded in said adhesive; and
   a protective plate attached to said sensing chip by means of said adhesive, said protective plate forming an exterior surface of the fingerprint sensing device.

2. The fingerprint sensing device according to claim 1, wherein said adhesive has a thickness at least equal to said height of said portion of said bond wire protruding above said sensing plane.

3. The fingerprint sensing device according to claim 1, wherein said adhesive is an adhesive film comprising:
   a first adhesive layer arranged in contact with said sensing elements;
   an intermediate carrier layer; and
   a second adhesive layer arranged in contact with said protective plate.

4. The fingerprint sensing device according to claim 3, wherein said first adhesive layer has a thickness at least equal to a height of said portion of said bond wire protruding above said sensing plane.

5. The fingerprint sensing device according to claim 3, wherein said intermediate carrier layer comprises a dielectric material.

6. The fingerprint sensing device according to claim 5, wherein said intermediate carrier layer comprises a material having an electric field breakdown strength of at least 100 V/µm, and preferably of at least 200 V/µm.

7. The fingerprint sensing device according to claim 3, wherein said intermediate carrier layer comprises a polyimide film.

8. The fingerprint sensing device according to claim 1, further comprising:
a frame arranged on said substrate and surrounding said sensing chip, said frame having a height from the substrate larger than a height of the sensing chip and a height lower than or equal to a combined height of said sensing chip and said adhesive; wherein said second bond pad located on said substrate is located between said sensing chip and said frame.

9. The fingerprint sensing device according to claim 8, further comprising a sealing material arranged between said frame and said protective plate configured to seal a gap between said frame and said protective plate.

10. The fingerprint sensing device according to claim 8, further comprising a filling material arranged between said sensing chip and said frame, filling a space between said sensing chip and said frame.

11. The fingerprint sensing device according to claim 10, wherein said adhesive is arranged and configured to cover said filling material.

12. The fingerprint sensing device according to claim 8, wherein said adhesive is arranged and configured to cover said frame.

13. The fingerprint sensing device according to claim 8, wherein said frame is bezel-shaped having an inner recessed ledge configured to receive said protective plate.

14. The fingerprint sensing device according to claim 8, wherein said protective plate is mechanically attached to said frame.

15. The fingerprint sensing device according to claim 8, wherein said frame is electrically conductive.

16. The fingerprint sensing device according to claim 15, further comprising a conductive adhesive connecting said frame to said substrate.

17. The fingerprint sensing device according to claim 15, further comprising a plurality of bond wires arranged on said substrate, said bond wires protruding from said substrate and being in contact with said frame such that an electrical connection is formed between said substrate and said frame by means of said bond wires.

18. The fingerprint sensing device according to claim 1, further comprising a frame being an integral part of said protective plate, said frame extending from said protective plate towards said substrate to encircle said sensing chip such that said bond pad of said substrate is located between said sensing chip and said frame.

19. The fingerprint sensing device according to claim 1, wherein said protective plate has a geometry different from a geometry of said sensing chip.

20. The fingerprint sensing device according to claim 1, wherein said sensing chip further comprises:
a plurality of charge amplifiers, one charge amplifier connected to each of said sensing structures, for providing a sensing signal indicative of a change of a charge carried by the sensing structure resulting from a change in a potential difference between the finger and the sensing structure.

21. A method of manufacturing a fingerprint sensing device, said method comprising the steps of:
providing a sensing chip comprising a plurality of sensing elements having a surface defining a sensing plane, each sensing element being configured to provide a signal indicative of an electromagnetic coupling between said sensing element and a finger placed on an exterior surface of the fingerprint sensing device;
arranging said sensing chip on a substrate comprising readout circuitry;
performing wire bonding to connect a bond pad of said sensing chip to a corresponding bond pad of said substrate by means of a bond wire, wherein said bond pad of said sensing chip is located in said sensing plane, such that a portion of said bond wire protrudes above said sensing plane;
arranging an adhesive on said sensing chip to cover said sensing chip, such that said portion of said bond wire protruding above said sensing plane is embedded in said adhesive; and
arranging a protective plate on said adhesive film, such that said protective plate is attached to said sensing chip, said protective plate forming an exterior surface of said fingerprint sensing device.

22. The method according to claim 21, wherein the step of arranging an adhesive on said sensing chip comprises arranging an adhesive film comprising a first adhesive layer in contact with said sensing element, an intermediate carrier layer, and a second adhesive layer configured to be in contact with said protective plate.

23. The method according to claim 22, wherein said intermediate carrier layer comprises a dielectric material.

24. The method according to claim 21, wherein the step of arranging an adhesive comprises arranging an adhesive covering the entire surface area of the sensing chip.

25. The method according to claim 21, wherein the step of arranging an adhesive is performed at a temperature equal to or higher than the glass-liquid transition temperature, $T_g$, of said adhesive.

26. A method of manufacturing a fingerprint sensing device, said method comprising the steps of:
providing a sensing chip comprising a plurality of sensing elements having a surface defining a sensing plane, each sensing element being configured to provide a signal indicative of an electromagnetic coupling between said sensing element and a finger placed on an exterior surface of the fingerprint sensing device;
arranging said sensing chip on a substrate comprising readout circuitry;
performing wire bonding to connect a bond pad of said sensing chip to a corresponding bond pad of said substrate by means of a bond wire, wherein said bond pad of said sensing chip is located in said sensing plane, such that a portion of said bond wire protrudes above said sensing plane;
arranging an adhesive on said sensing chip in contact with said sensing elements such that said portion of said bond wire protruding above said sensing plane is embedded in said adhesive;
forming a cover comprising a protective plate portion and a frame portion protruding from said protective plate; said frame portion being configured to surround said sensing chip when said cover is arranged on said sensing chip and said substrate; and arranging said cover on said sensing chip and said substrate such that said protective plate portion is attached to said sensing chip by means of said adhesive.

* * * * *